(12) United States Patent
Ma et al.

(10) Patent No.: US 7,927,121 B2
(45) Date of Patent: *Apr. 19, 2011

(54) ELECTRICAL CONNECTOR

(75) Inventors: Hao-Yun Ma, Tu-Cheng (TW); Darrell Wertz, Chandler, AZ (US)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/799,251

(22) Filed: Apr. 20, 2010

(65) Prior Publication Data

US 2010/0267253 A1  Oct. 21, 2010

Related U.S. Application Data

(63) Continuation of application No. 11/728,392, filed on Mar. 26, 2007, now Pat. No. 7,699,636.

(51) Int. Cl.
*H01R 13/625* (2006.01)
(52) U.S. Cl. ...................................................... 439/331
(58) Field of Classification Search .................. 439/331, 439/330, 71, 342
See application file for complete search history.

(56) References Cited

U.S. PATENT DOCUMENTS

| 4,341,433 | A | * | 7/1982 | Cherian et al. | 439/525 |
|---|---|---|---|---|---|
| 4,511,201 | A | * | 4/1985 | Baker et al. | 439/260 |
| 4,692,790 | A | * | 9/1987 | Oyamada | 257/727 |
| 5,167,515 | A | * | 12/1992 | Matsuoka et al. | 439/108 |
| 6,685,494 | B1 | * | 2/2004 | McHugh et al. | 439/342 |
| 6,726,500 | B1 | * | 4/2004 | McHugh et al. | 439/331 |
| 6,776,625 | B2 | * | 8/2004 | Ma | 439/73 |
| 6,776,642 | B1 | * | 8/2004 | McHugh et al. | 439/331 |
| 7,025,603 | B2 | * | 4/2006 | Ma | 439/73 |
| 7,033,198 | B2 | * | 4/2006 | Chiang | 439/331 |
| 7,097,464 | B1 | * | 8/2006 | McHugh et al. | 439/73 |
| 7,160,128 | B2 | * | 1/2007 | Ma | 439/331 |
| 7,258,563 | B2 | * | 8/2007 | Ju | 439/331 |
| 7,402,065 | B1 | * | 7/2008 | Polnyi | 439/331 |
| 7,476,115 | B2 | * | 1/2009 | Zhang et al. | 439/331 |
| 7,476,122 | B2 | * | 1/2009 | Zhang | 439/485 |
| 2004/0259407 | A1 | * | 12/2004 | Chiang | 439/331 |
| 2004/0266246 | A1 | * | 12/2004 | Hashimoto et al. | 439/331 |
| 2005/0106923 | A1 | * | 5/2005 | Ma | 439/331 |
| 2005/0287858 | A1 | * | 12/2005 | Toda et al. | 439/331 |
| 2006/0121765 | A1 | * | 6/2006 | Ma | 439/331 |
| 2008/0057751 | A1 | * | 3/2008 | Zhang | 439/73 |
| 2008/0113545 | A1 | * | 5/2008 | Zhang et al. | 439/345 |

* cited by examiner

*Primary Examiner* — T C Patel
*Assistant Examiner* — Vladimir Imas
(74) *Attorney, Agent, or Firm* — Andrew C. Cheng; Wei Te Chung; Ming Chieh Chang

(57) ABSTRACT

An electrical connector (1) comprises an insulative housing (2), a plurality terminals received in the housing (2), a stiffener (3) engaged with the housing (2), a clip (5) and a lever (4) pivotably mounted on two opposite sides of the stiffener (3). The lever (4) comprises a pair of locating portions (424) pivotably received in the stiffener (3), an offset actuating portion (422) between the locating portions (424), and an operating portion (43) extending upward and frontward from an end of the locating portions (424) and bent far away from the housing (2).

20 Claims, 5 Drawing Sheets

ELECTRICAL CONNECTOR

This application is a CA (Continuation of Application) of U.S. patent application Ser. No. 11/728,392, filed Mar. 26, 2007 now U.S. Pat. No. 7,669,636.

BACKGROUND OF THE INVENTION

1. Field of the Invention

The present invention relates to the art of electrical connectors, and more particularly to an electrical connector provided for mechanically and electrically connecting a chip module to a printed circuit board (PCB).

2. Description of the Prior Art

Electrical connectors are widely used in the connector industry for electrically connecting a chip module to a printed circuit board (PCB) in personal computer. Conventionally, an electrical connector mainly comprises an insulative housing, a multiplicity of terminals received therein, a load plate and a lever pivotably mounted on two opposite sides of the housing.

Referring to FIG. 5, a conventional electrical connector 10' comprises an insulative housing 20', a plurality of terminals received in corresponding passageways of the housing 20', a metal stiffener 30' partly covering and reinforcing the housing 20', a metal clip 50 pivotably attached to an end of the stiffener 30', and a lever 60' pivotably mounted to an opposite end of the stiffener 30' for engaging with the lever 60'.

The housing 20' defines a multiplicity of passageways in a rectangular array, for interferentially receiving corresponding terminals.

The stiffener 30' is substantially rectangular and comprises a pair of lateral sides 36' each having a substantially L-shaped cross-section, a left end 32' having an U-shaped cross-section, and a right end 34' having an L-shaped cross-section. The housing 20' is fittingly received in the stiffener 30'. The U-shaped cross-section comprises a pair of stopper 322' extending therefrom and an anchoring portion 324' disposed on one stopper 322' for locating the locating portion 624' of the lever 60'.

The lever 60' comprises a pair of locating portions 624' pivotably received in the chamber 322' of the stiffener 30', an offset actuating portion 622' between the locating portions 624', and an operating portion 63' extending perpendicularly from an end of one of the locating portions 624' and bent towards the offset actuating portion 622'. The operating portion 63' is disposed outside of the stiffener 30'.

When the electrical connector 10' is assembled, the lever is engaged with the anchoring pad of the stiffener 30. The operating portion is used to drive the cover engaging/disengaging with the housing, however the operating portion in the art is disposed too close to the connecting portion 61' of the lever, which decreases the space for users operating the lever to open/close the cover. In addition, the lever of the art uses too much material and needs a complicate manufacturing process.

Thus, there is a need to provide an electrical connector that overcomes the above-mentioned problems.

SUMMARY OF THE INVENTION

Accordingly, an object of the present invention is to provide an electrical connector able to ensure a stable and reliable mechanical and electrical connection between the chip module and the printed circuit board.

To fulfill the above-mentioned object, an electrical connector in accordance with the preferred embodiment comprises an insulative housing, a plurality terminals received in the housing, a stiffener engaged with the housing, a clip and a lever pivotably mounted on two opposite sides of the stiffener and a securing member engaging with the locating portion of the lever. The lever comprises a pair of locating portions pivotably received in the stiffener, an offset actuating portion between the locating portions, and an operating portion extending upward and frontward from an end of the locating portions and bent far away from the housing.

Relative to the present technology, the electrical connector in accordance with the prefer embodiment of the invention defines a lever comprising an operating portion extending upward and frontward from an end of the locating portions and bent far away from the housing, which increases the space for users operating the lever to open or close the cover, and decreases the material and process for manufacturing the lever.

Other objects, advantages and novel features of the present invention will become more apparent from the following destoppered description when taken in conjunction with the accompanying drawings, in which:

DESCRIPTION OF PREFERRED EMBODIMENT OF THE INVENTION

Reference will now be made to the drawings to describe the present invention in destopper.

Figure 1:
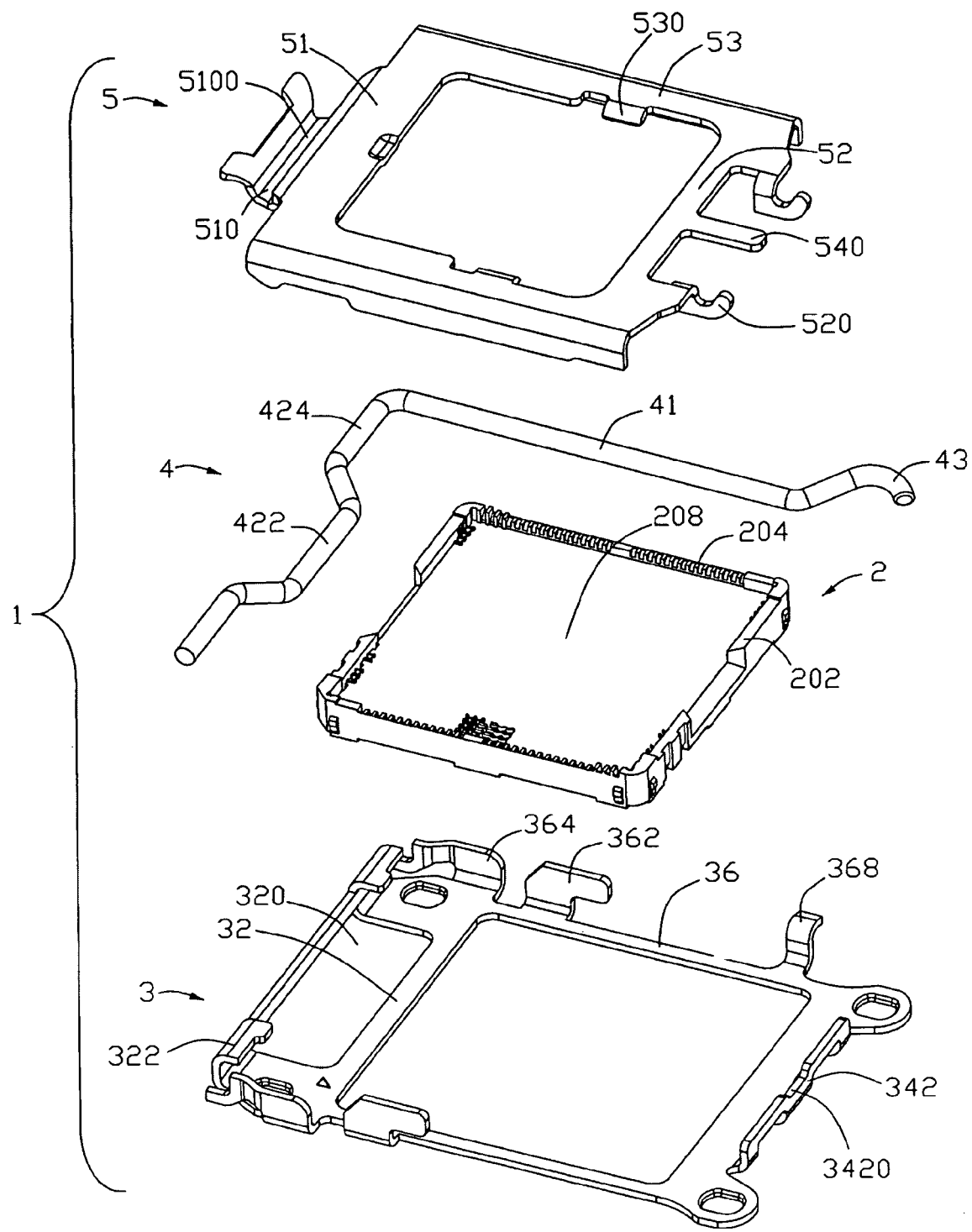
FIG. 1 is an exploded, isometric view of an electrical connector in accordance with a preferred embodiment of the present invention.

FIG. 1 is an exploded, isometric view of an electrical connector 1 in accordance with a preferred embodiment of the present invention. The electrical connector 1 provided for electrically connecting a chip module (not shown) to a circuit substrate (not shown) includes an a generally rectangular insulative housing 2, a multiplicity of terminals received in the housing 2, a metal stiffener 3 partly covering and reinforcing the housing 2, a lever 4 pivotably attached to an end of the stiffener 3, a metal clip 5 pivotably mounted to an opposite end of the stiffener 3 for engaging with the lever 4.

Figure 2:
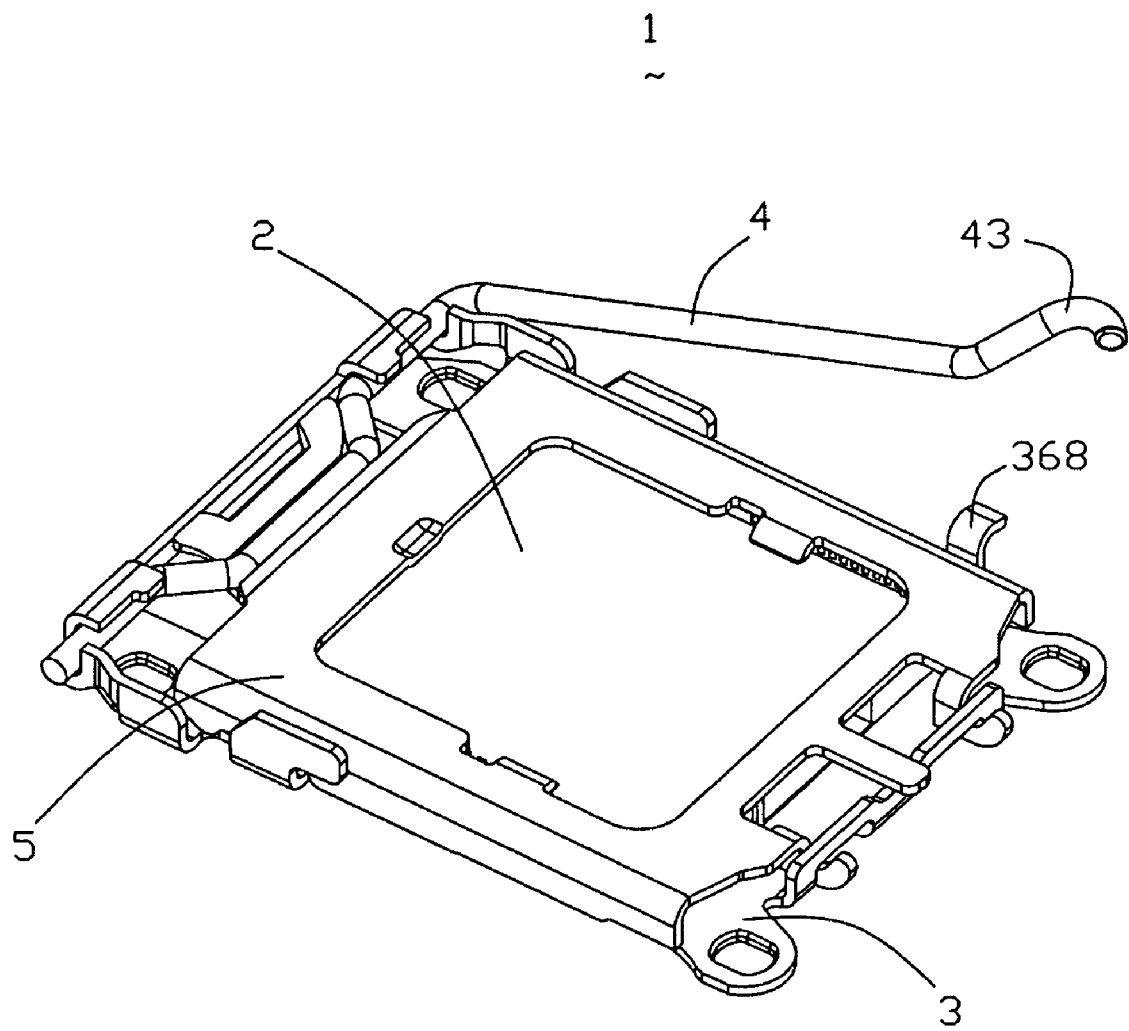
FIG. 2 is an assembled, isometric view of the electrical connector shown in FIG. 1, wherein the lever is open.

Referring to FIG. 1-2, the housing 2 includes a pair of first sidewalls 202 opposite to each other and two opposite, a pair of second sidewalls 204 connecting with the first sidewalls 202 respectively. The four sidewalls cooperatively define a generally rectangular cavity 208 in a middle section thereof for receiving the chip module therein. A multiplicity of passages is defined in a portion of the housing 2 under the cavity 208, for receiving a corresponding number of the terminals 21 therein respectively.

Referring to FIG. 2, the stiffener 3 is substantially rectangular and comprises a pair of lateral sides 36 each having a pair of substantially L-shaped sections 362 and for engaging with sidewalls 53 of the clip 5 a pair stopper wall 364 adjacent to the L-shaped sections 362, a left end 32 having a pair of U-shaped cross-section 322 and a receiving recess 320 for receiving the engaging portion 510 of the clip 5 therein, and a right end 34 having a supporting section 342 upwardly extending from a right side of the stiffener 3 for supporting the stopper 540 of the clip 5 thereon, wherein one of the lateral side 36 defines a locking hook 368 for engaging with lever 4.

Referring to FIG. 2, the lever 4 includes a connecting portion 41, an actuating portion 42 and an operating portion 43. The actuating portion 42 includes a pair of locating portions 424 pivotably received in the chambers 322 of the stiffener 20, and an offset actuating portion 422 between the locating portions 424. The operating portion 43 extends upward and frontward from an end of the locating portions 424 and is bent far away from the housing 2. The operating portion 43 is disposed outside of the stiffener 3. When oriented at a horizontal position parallel to the housing 2, the operating portion 43 engages with the locking hook 38 on the stiffener 3. The operating portion 43 has a first portion 431 and a second portion 432, and the first portion 431 connects with the connecting portion 41 and extends away from the connecting portion 41.

Referring to FIG. 2, the clip 5 has a first side 51, a second side 52 opposite to the first side 51 and two opposite third slant sides 53 adjacent the first and second sides 51, 52 respectively. The first side 51, the second side 52 and third sides 53 cooperatively form a hollow receiving space. The third sides 53 are bent toward the housing 2 and each of the third sides 53 defines a pressing portion 530 extending from inner side thereof and bent toward the housing 2 in a middle portion thereof. An engaging portion 510 is extended arcuately from an outside of the first side 51 thereof defining a receiving portion for receiving the offset actuating portion 422 of the lever therein. A pair of spaced securing portions 520 is extended arcuately from the second side 52 thereof and pivotably received in the slots 324 of the stiffener 30, and a stopper 540 formed between the securing portions 520. When the clip 5 is oriented at a horizontal position parallel to the housing 2, the engaging portion 510 of the clip 5 engages with the actuating portion 422 of the lever 4, thereby the driving actuating portion 422 to press the chip module on the terminals 21. When the clip 5 is oriented at a vertical position perpendicular to the housing 2, the stopper 540 abuts against the stiffener 3 to prevent the clip 5 from being over-rotated.

Figure 3:
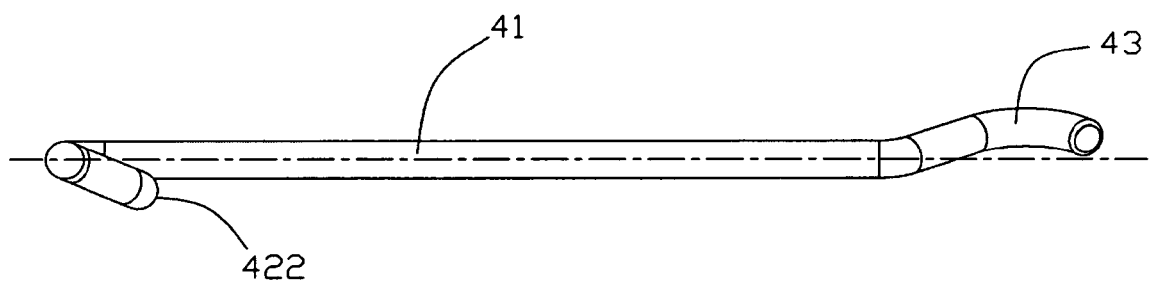
FIG. 3 is an isometric view of the lever of the electrical connector shown in FIG. 1.
Figure 4:
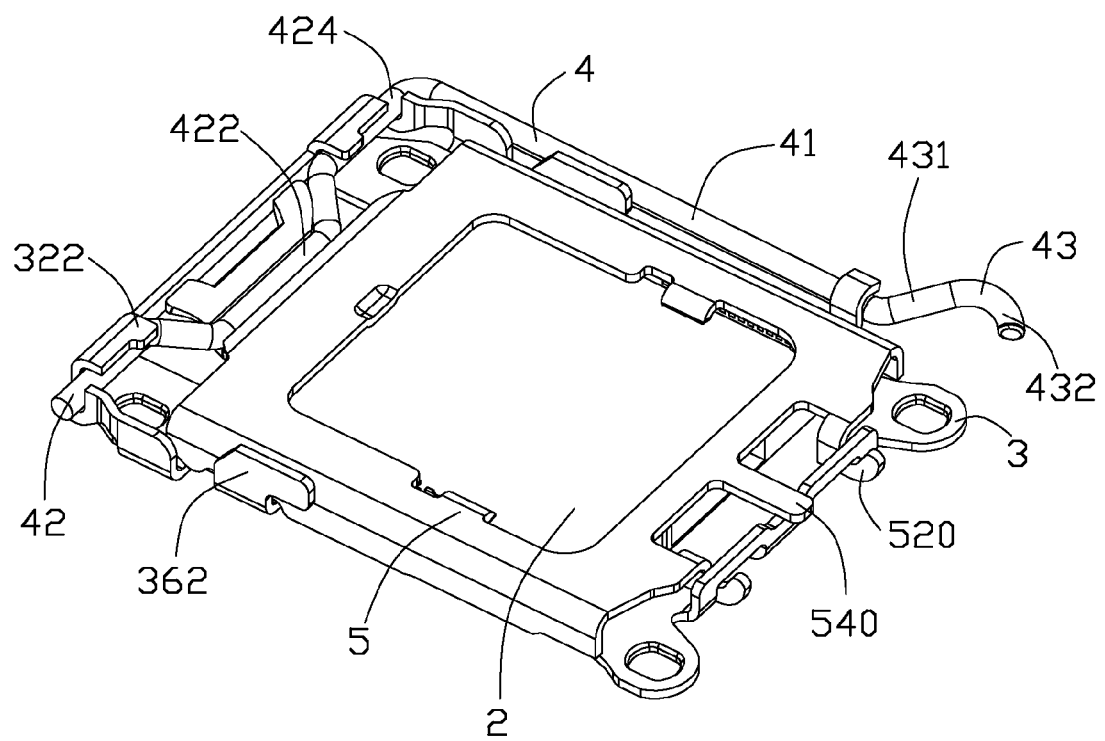
FIG. 4 is an assembled view of the electrical connector shown in FIG. 1.
Figure 5:
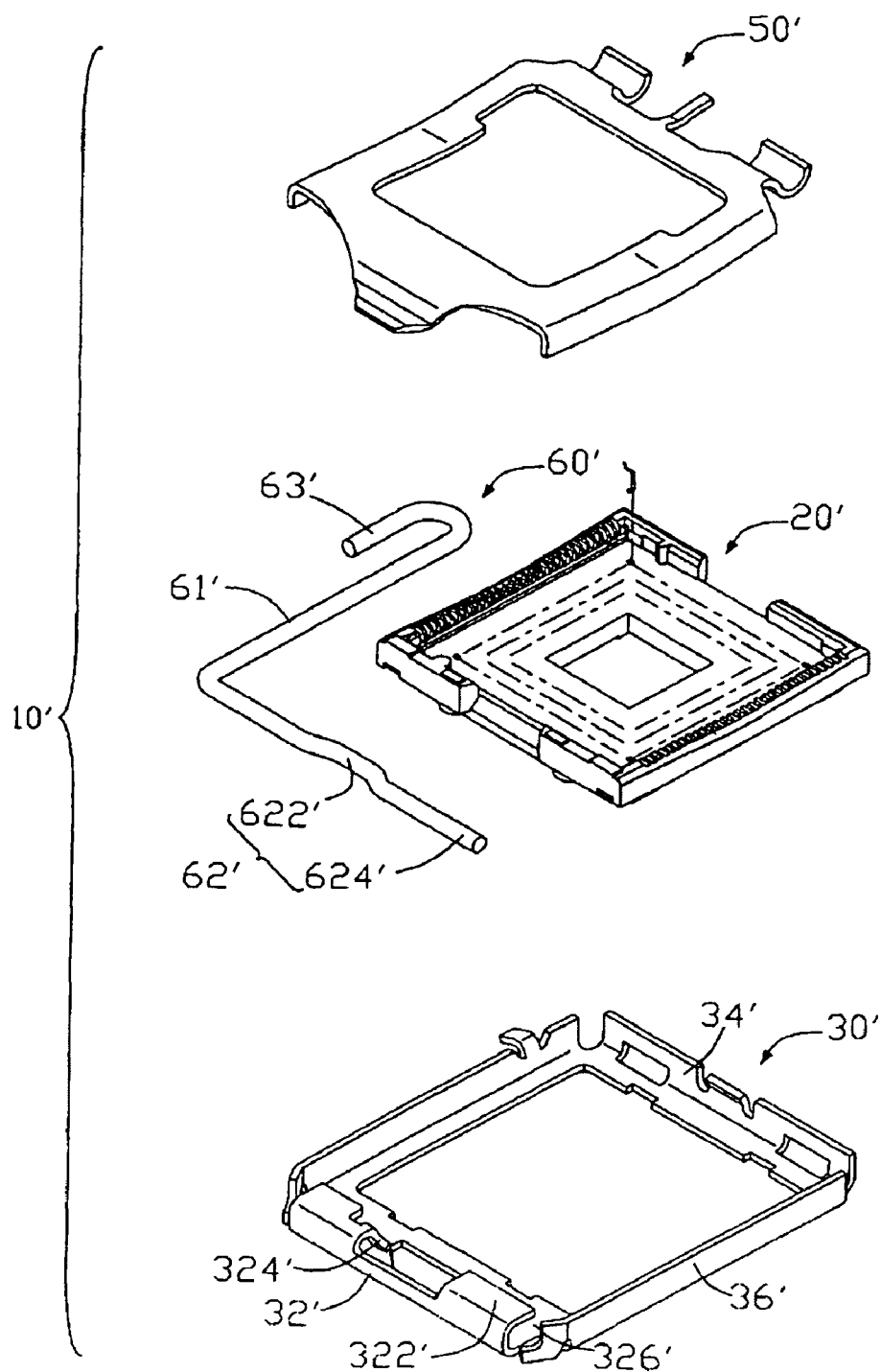
FIG. 5 is an exploded, isometric view of a conventional electrical connector.

Referring to FIGS. 1-4, since the operating portion 43 is bent outwardly from the end of the connecting portion 41 along a direction away from the insulative housing 2, the stiffener 3 and the metal clip 5 and upwardly gradually, then curved inwardly toward the insulative housing 2 and downwardly gradually. The free end of the operating portion 43 does not extend beyond the outermost contour of the stiffener 3. Therefore, the upwardly curved then downwardly curved operating portion 43 provides the same user-friendlines, but has less material and thus is cheaper. Further, as shown in FIG. 3, if we define a central axis of the connecting portion 41 along its extending direction, the operating portion 43 is wholly located above the central axis of the connecting portion 41 with its free end substantially contact the central axis. In addition, the furthest section of the operating portion 43 relative to the central axis is substantially aligned with an axis defined by a pair of mounting holes of the stiffener 3.

Although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. A fastening device for used with a socket electrically connecting an electronic package, comprising:
   a stiffener;
   a load lever comprising a connecting portion extending along a longitudinal direction and defining a longitudinal axis thereof, an actuating portion extending from a longitudinal end of the connecting portion and pivotally attached to the stiffener and an operating portion extending from the other longitudinal end of the connecting portion, and including a first portion connecting with the connecting portion and extending laterally away from the longitudinal axis of the connecting portion in a top view when the load level is set in a horizontal position, and a second portion extending away from both the longitudinal end and the other longitudinal end of the connecting portion along a direction substantial parallel to the longitudinal axis of the connecting portion, the whole operation portion and the actuating portion located on two opposite sides of the longitudinal axis in the top view; and
   a locking member engaging with the operating portion of the load lever to lock the lever in a closed state.

2. The fastening device as claimed in claim 1, wherein the operating portion is located outside of the connecting portion without overlapping with the connecting portion in the longitudinal direction.

3. The fastening device as claimed in claim 1, wherein the first and the second portions of the operating portion form an arched shape, and the first portion upwardly and outwardly extends away from the connecting portion, and the second portion extends substantially in the longitudinal direction.

4. The fastening device as claimed in claim 2, wherein the operating portion extends essentially higher than the longitudinal axis of the connecting portion in a side view.

5. An electrical connector mounted on a printed circuit board, comprising:
   a stiffener mounted on the printed circuit board;
   a loading member pivotally attached to the stiffener, the loading member comprising a load lever, the load lever comprising a connecting portion extending in a longitudinal direction and defining a longitudinal axis, and an operating portion extending from a longitudinal end of the connecting portion, the operating portion first extending away from the longitudinal axis of the connecting portion and then being bent toward the longitudinal axis of the connecting portion; and
   a locking member engaging with the load lever to lock the loading member in a close state when the operating portion is operated downwardly toward the printed circuit board and brings the connecting portion to a horizontal position.

6. The electrical connector as claimed in claim 5, further comprising an insulative housing with a plurality of terminals, the insulative housing is mounted on the printed circuit board beside the stiffener.

7. The electrical connector as claimed in claim 6, wherein the loading member comprises a clip, the clip is pivotally assembled and located in a horizontal position to cover the insulative housing when the loading member is locked in the close state.

8. The electrical connector as claimed in claim 5, wherein the locking member is provided by the stiffener.

9. The electrical connector as claimed in claim 5, wherein the operating portion is located beyond the connecting portion along the longitudinal direction without overlapping the connecting portion.

10. The electrical connector as claimed in claim 6, wherein the operating portion is bent slantways and upwardly from the longitudinal end of the connecting portion.

11. The electrical connector as claimed in claim 5, wherein the lever comprises an actuating portion extending from the other longitudinal end of the connecting portion and pivotally mounted to the stiffener.

12. The electrical connector as claimed in claim 5, wherein the portion of the operating portion of the lever is of arcuate shape and firstly extends away from the longitudinal axis of the connecting portion and forwardly and upwardly gradually and then extends toward the longitudinal axis of the connecting portion and forwardly and downwardly gradually.

13. The electrical connector as claimed in claim 12, wherein the operating portion of the lever is located above the longitudinal axis of the connecting portion, and the actuating portion of the lever is located below the longitudinal axis of the connecting portion.

14. A lever for use with a fastening device disposed around a socket connector, comprising
an actuating portion forming an offset actuating portion substantially in a middle thereof;
a connecting portion defining an longitudinal axis, the connecting portion connecting with the actuating portion at a first end thereof and extending substantially orthogonal to the actuating portion; and
an operating portion defined adjacent to a second end of the connecting portion and having a first portion extending laterally away from the longitudinal axis of the connecting portion in a top view to define a lateral operation area for supporting a user.

15. The lever as claimed in claim 14, wherein said operation portion further includes a second portion extending from the first portion and turning to substantially parallel to the longitudinal axis of the operating portion wherein the first and second portions of the operating portion commonly define said lateral operation area.

16. The lever as claimed in claim 14, wherein the offset actuating portion is angled to a plane defined by both the actuating portion and the connecting portion.

17. The lever as claimed in claim 15, wherein the connecting portion is tilted above a plane defined by the actuating portion and the connecting portion.

18. The lever as claimed in claim 15, wherein the second portion further extends from substantially parallel to the longitudinal axis of the connecting portion to a direction which intersects to the longitudinal axis.

19. The lever as claimed in claim 15, wherein the first portion extends also upward from the longitudinal axis.

20. The electrical connector as claimed in claim 5, wherein the locking member is located proximate the longitudinal end of the connecting portion.

* * * * *